United States Patent
Hong et al.

(10) Patent No.: US 6,881,444 B2
(45) Date of Patent: Apr. 19, 2005

(54) PROCESS FOR FABRICATING MONOLAYER/MULTILAYER ULTRATHIN FILMS

(76) Inventors: Jong-Dal Hong, 311-1507 Hyundai Apt., 3cha, Sangok3-Dong, Bupyong-Gu, Inchon-City, 403-777 (KR); Kook-Heon Char, A-304 Banpo Hyundai Villa, 104-16 Banpo4-Dong, Seocho-Gu, Seoul, 137-044 (KR); Jin-Han Cho, 315-66, Ssangmun3-Dong, Dobong-Gu, Seoul 132-033 (KR)

( * ) Notice: Subject to any disclaimer, the term of this patent is extended or adjusted under 35 U.S.C. 154(b) by 290 days.

(21) Appl. No.: 10/050,599
(22) Filed: Jan. 18, 2002

(65) Prior Publication Data
US 2003/0026898 A1 Feb. 6, 2003

(30) Foreign Application Priority Data
Jul. 11, 2001 (KR) ........................................ 2001-41773

(51) Int. Cl.⁷ .............................. B05D 1/38; B05D 3/12
(52) U.S. Cl. ........................ 427/240; 427/352; 427/353; 427/407.1; 427/425
(58) Field of Search .............................. 427/240, 430.1, 427/407.1, 352, 353, 425; 118/52, 320

(56) References Cited

U.S. PATENT DOCUMENTS

| | | | |
|---|---|---|---|
| 5,208,111 A | | 5/1993 | Decher et al. ............... 428/420 |
| 5,393,624 A | * | 2/1995 | Ushijima ...................... 430/30 |
| 5,518,767 A | | 5/1996 | Rubner et al. ............... 427/259 |
| 5,536,573 A | | 7/1996 | Rubner et al. ............... 428/378 |
| 6,022,590 A | * | 2/2000 | Ferguson et al. ........... 427/354 |
| 6,225,240 B1 | * | 5/2001 | You et al. .................... 438/782 |
| 6,589,665 B1 | * | 7/2003 | Chabrecek et al. ......... 428/520 |
| 2002/0086160 A1 | * | 7/2002 | Qiu et al. .................... 428/413 |
| 2003/0003272 A1 | * | 1/2003 | Laguitton .................... 428/141 |

OTHER PUBLICATIONS

Dubas, Stephen T. et al., "Factors Controlling the Growth of Polyelectrolyte Multilayers", Macromolecules 1999, vol. 32, pp. 8153–8160.
Schlenoff, Joseph B. et al., "Sprayed Polyelectrolyte Multilayers", Langumir 2000, vol. 16, pp. 9968–9969.
Cho, Jinhan et al., "Fabrication of Highly Ordered Multilayer Films Using a Spin Self–Assembly Method", Adv. Mater. 2001, vol. 13, No. 14, pp. 1076–1078.
"Metal Nanoparticle/Polymer Superlattice Films: Fabrication and Control of Layer Structure"; Schmitt et al., Adv. Mater., 1997, 9, No. 1, pp. 61–65.

(Continued)

*Primary Examiner*—Kirsten Jolley
(74) *Attorney, Agent, or Firm*—Roylance, Abrams, Berdo & Goodman, L.L.P.

(57) ABSTRACT

The present invention provides a process for fabricating ultrathin monolayers or ultrathin multilayer films, the process comprising the steps of: introducing positive or negative charge or a material capable of hydrogen-bonding to a substrate and placing the substrate on a spinner(pretreating step); introducing a material (A) bindable with the material deposited on the substrate, and spinning the substrate at 500 rpm to 30000 rpm for 4 to 200 seconds(first coating step); dropping washing solvent onto the substrate after completion of the first coating and spinning the substrate at 500 rpm to 30000 rpm for 4 to 200 sec to remove weakly-bound material (A) and form a thin film (A)(first washing step); introducing another material (B) bindable with the material (A) coated on the substrate and further coating it in the same condition as of the first coating(second coating step), dropping washing solvent onto the substrate after completion of the second coating and spinning the substrate at 500 rpm to 30000 rpm for 4 to 200 sec to remove the weakly-bound material (B) and form a thin film(B)(second washing step), wherein the entire above steps are more than once repeated.

11 Claims, 12 Drawing Sheets

OTHER PUBLICATIONS

"The Pseudo–Ordered Structure in Light Emitting Porous and Nanocrystalline Silicon Films", Wang et al., Appl. Phys. Lett., 70(17), Apr. 28, 1997, 2265–2267.

"Tuning the Performance of Layer–by–Layer Assembled Organic Light Emitting Diodes by Controlling the Position of Isolating Clay Barrier.Sheets", Eckle et al., Nano Letters, 2001, vol. 1, No. 1, pp. 45–49.

"Mechanism of and Defect Formation in the Self–Assembly of Polymeric Polycation–Montmorillonite Ultrathin Films", Kotov et al., J. Am. Chem. Soc., 1997, 119, 6821–6832.

"Electroluminescence Studies on Self–Assembled Films of PPV and CdSe Nanoparticles", Gao et al., J. Phys. Chem. B. 1998, 102, 4096–4103.

* cited by examiner

A

B

A, B, A, B, ...

PROCESS FOR FABRICATING MONOLAYER/MULTILAYER ULTRATHIN FILMS

BACKGROUND OF INVENTION

1. Field of the Invention

The present invention relates to a fabricating method of multilayer ultrathin films. More specifically, the invention relates to a fabricating method of well-organized multilayer films using spin self-assembly method with a very short process time.

2. Description of the Prior Art

Ultrathin multilayer films have attracted much interest for their wide applications such as sensors, integrated optics, friction reducing coating, biological surface, light-emitting devices (LED), or surface orientation layers.

In particular, as electric, electronic, communication and computer industries progress, ultrathin materials with thickness in the range of 5 to 10 nm are expected to play an important part in developing up-to-date devices and many studies on ultrathin films are being carried out.

Such ultrathin films, which are usually prepared by coating an organic single-molecular thin layer onto the substrate, can be used for modifying characteristics of the substrate surface, for example, for promoting adhesive strength, preventing friction or corrosion, or modifying electronic or optical properties.

For sufficient introduction and expression of desired properties in substrates, it is basically required that the thin film is uniform in thickness and has a well-ordered orientation. If single monolayer coating cannot sufficiently change the property of the substrate surface to the desired degree, multilayer ultrathin coating of substrate is needed.

For the ultrathin film to be useful in various up-to-date applications, it is required that the thickness of the thin film can be controlled in the Angstrom scale and the thin film can also be formed between different materials.

For the preparation of ultrathin monolayer film, spin-coating process has been known. The method, in which coating agent is placed onto a substrate and then the substrate is rotated at a high speed, can form a uniform thin film in a short period of time and such thin films are, for example, utilized in the production of semiconductor chip.

Although the above spin coating process is useful for preparing a relatively thick single layer film with a thickness more than 10 nm, it is not appropriate for the ultrathin film with thickness less than 10 nm. Particularly, the thickness of the film layer is not easily controlled and the applicable solvent is limited because the process does not use attractive force between multilayers in a thin film and the solvent is required to be insoluble on the respective film layers, which make it difficult to prepare ultrathin films with multilayer structure.

The old and conventional process for preparing multilayer ultrathin films is the Langmuir-Blodgett (LB) technique. In the Langmuir-Blodgett (LB) technique, a single molecular film is formed on water surface and is transferred onto the surface of a solid substrate to form an ultrathin film, and this process is repeated to prepare multilayer ultrathin films.

However, the LB technique has problems in that the prepared films are unstable and the condition of the technique is quite complicated, and thus is inconvenient for the automation and the large-scale application.

For solving the problem of the above method, U.S. Pat. No. 5,208,111 discloses a method for ultrathin thin films or multilayer thin films by introducing a molecular self-assembly method based on the electrostatic force between layers.

In the method, the substrate substituted with ion or ionizable compound is immersed in a water soluble polyelectrolyte solution so that the polyions are adsorbed onto the substrate surface to form a single molecular film, as a result, the charge of the substrate surface is changed from anion to cation or vice versa.

In this method, the substrate coated with one polyelectrolyte is again immersed in an aqueous polelectrolyte with opposite charge.

FIG. 1 shows a prior art fabrication of a multilayered thin film by a molecular self-assembly, in which a silicate or glass substrate is modified with a positively charged material to convert the charge of the substrate into positive charge (1) and then in contact with a negatively charged material (2) (typically, polyelectrolyte) to form an ultrathin film. Repetition of this cycle produces a multilayer thin film consisting of alternating layers of polycations and polyanions.

The thickness and conformation of each polymer layer deposited are determined by physical and chemical characteristics of the depositing solution. For example, solutions with relatively high polyion concentrations or high ionic strengths favor the formation of thicker polyelectrolyte layer due to the increased diffusion rate and the structural change of polymer chain whereas very dilute solutions produce thinner monolayers on the substrate.

This approach can be used to manipulate a variety of different polyions including conjugated polyions. Further, the method is expanding its application, for example, for preparing a hybrid multilayer thin film in which organic materials are bound with various inorganic materials such as nano-sized gold particle (Adv. Mater., 1997, 9, 61), $Fe_3O_4$ (Appl. Phys. Lett., 1997, 71, 2265), montmorillonite-inorgnic material with platelet structure (Nano Lett., 2991, 1, 45; J. Am. Chem. Soc., 1997, 119, 6821), CdS, CdSe, CdTe and ZnS known as semiconductor and quantum particles (J. Phys. Chem. B. 1998, 102, 4096) and many related studies are currently in progress.

While the above method forms ultrathin film using electrostatic attraction of ion or ionizable compound, U.S. Pat. No. 5,518,767 discloses a technique where a ultrathin film is formed by the attraction between a conductive polymer containing partially positive charge and polyions with negative charge instead of ionization.

In addition, U.S. Pat. No. 5,536,573 discloses a technique, as an improvement of the above U.S. Pat. No. 5,518,767, for preparing multilayer thin film by electrostatic attraction or hydrogen bonding using a conductive polymers in which the charge capacity can be controlled depending on the amount of dopant and the type of polyanion, to be applied to small-size electronic devices, chemical or biological sensors, anti-corrosion coatings and anti-static coatings.

In the above described methods, however, the thin film formation is based on the adsorption by the spontaneous diffusion of coating materials through their interactions such as electrostatic attraction, hydrogen bonding, or chemical bonding, and relatively long adsorption time of 5 to 30 minutes should be allowed to obtain stable thin films with a specific orientation.

This leads to several problems such as the long preparation time of the multilayer thin films and the reduction of productivity. In addition, without thorough washing using a flow of pure solvent after the adsorption of a polyelectrolyte layer, the weakly adsorbed polyelectrolyte chains significantly increase the surface roughness of the multilayer films, yielding poor film quality. Consequently, optimum conditions for both adsorption and careful washing steps are required in order to prepare well-defined multilayer films.

SUMMARY OF THE INVENTION

It is therefore the object of the present invention to provide a method for forming multilayer ultrathin film with a good film quality in a short process time, in contrast to the conventional method involving adsorption, washing and drying steps and requiring relatively long time for obtaining such uniform thin films.

In order to obtain the above object, the present invention provides a process for fabricating ultrathin monolayer or ultrathin multilayer film with a high degree of internal order, the process comprising the steps of:

introducing positive or negative charge or a material capable of hydrogen bonding to a substrate and placing the substrate on a spinner(pretreating step);

introducing a material (A) bindable with the material deposited on the substrate, and spinning the substrate at 500 rpm to 30000 rpm for 4 to 200 sec(first coating step);

dropping washing solvent onto the substrate after completion of the first coating and spinning the substrate at 500 rpm to 30000 rpm for 4 to 200 sec to remove weakly-bound material (A) and form a thin film (A)(first washing step);

introducing another material (B) bindable with the material (A) coated on the substrate and further coating it in the same condition as of the first coating(second coating step); and dropping washing solvent onto the substrate after completion of the second coating and spinning the substrate at 500 rpm to 30000 rpm for 4 to 200 sec to remove weakly-bound material (B) and form a thin film (B)(second washing step), wherein the entire above steps are more than once repeated.

The present invention of providing a process for fabricating ultrathin monolayers or ultrathin multilayer films is further characterized in that the respective first and second washing steps are repeated 0 to 3 times.

The present invention of providing a process for fabricating ultrathin monolayer or ultrathin multilayer films is further characterized in that the introduction of a material (A) or (B) is carried out by dropping or spraying the material (A) or (B) while the substrate is under spin.

The present invention of providing a process for fabricating ultrathin monolayer or ultrathin multilayers is further characterized in that the introduction of a material (A) is carried out by instantaneously immersing the substrate in a solution containing the material (A).

The present invention of providing a process for fabricating ultrathin monolayers or ultrathin multilayer films is further characterized in that the materials of the layers can be bound to each other by the electrostatic ionic bonding, hydrogen bonding or chemical bonding.

The present invention of providing a process for fabricating ultrathin monolayers or ultrathin multilayer film is further characterized in that the thickness of the respective thin films are controlled by solution concentration, addition of ionic salt, pH control, and spinning speed control.

The present invention of providing a process for fabricating ultrathin monolayers or ultrathin multilayer films is further characterized in that two or more different organic layers are alternatively laminated, or organic layer and inorganic layer are alternatively laminated.

The present invention of providing a process for fabricating ultrathin monolayer or ultrathin multilayer films is further characterized in that the spinning speed is 500 rpm to 30000 rpm and the spinning time is 4 to 200 sec for the first and second coating steps.

DETAILED DESCRIPTION OF THE INVENTION

Figure 1:
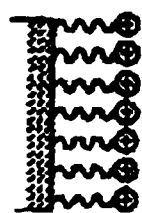
FIG. 1 is a schematic process for fabricating an organic/organic multilayer ultrathin film using the conventional dipping molecular SA method.
Figure 1:
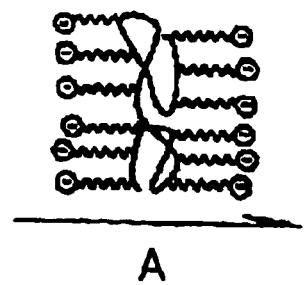
Figure 1:
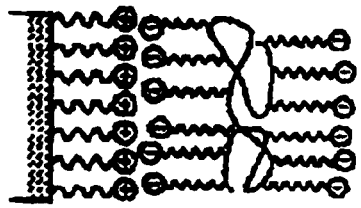
Figure 1:
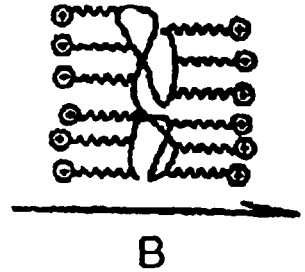
Figure 1:
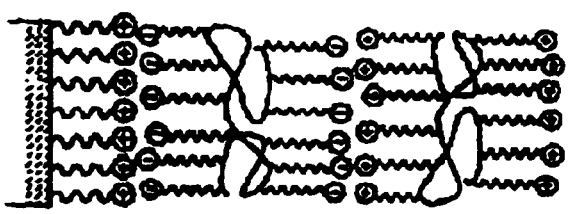

As a first step of the present invention, a substrate is modified to be negatively or positively charged, or treated by a material capable of hydrogen-bonding, and then placed on a spinner.

The substrate can be made from an organic or inorganic material. For the inorganic substrate, metals such as gold, palladium, platinum, glasses, ceramics, germanium or silicon can be employed and for the organic substrates, polymers such as conductive materials, semiconductive materials or insulating materials can be employed.

The process of introducing positive charge, negative charge or a material capable of hydrogen-bonding, can be selected from the previously known methods. For example, the introduction of negative charge onto the substrate surface can be accomplished by dipping the substrate in a blend solution of water, ammonia, hydrogen peroxide, or the like.

Then, a material (A) which can be bound with the charge or the material capable of hydrogen bonding attached to the substrate by various attraction forces (for example, ionic, hydrogen bonding, ion-metal coordinate and chemical bonds) is further introduced onto the above treated substrate, when the spinner is operated at 500 rpm to 30000 rpm for 4 sec to 400 sec, as a first coating step.

The coating time and spinning speed are chosen in consideration of time for solvent removal and the concentration of the organic or inorganic materials used are not limited to the above values.

The ionic bonding materials can be selected from polyelectrolytes such as poly(allylamine hydrochloride) (PAH) of formula 1 and poly(sodium 4-styrenesulfonate) (PSS) of formula 2 and inorganic nanoparticles such as gold nanoparticle and CdS nanoparticles of formula 3 for which the surfaces are negatively or positively charged, but are not limited to the above examples.

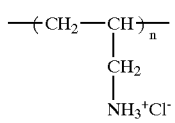

(Formula 1)

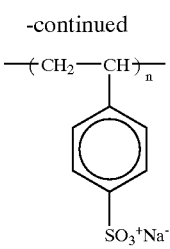

(Formula 2)

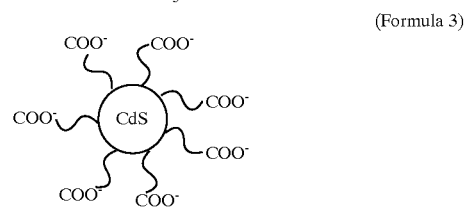

(Formula 3)

The materials capable of the hydrogen bonding can be cadmium selenide with carboxylic group of formula 4, polypyrrolidone of formula 5, polyvinylpyridine of formula 6 and polyaniline of formula 7, but are not limited to the above.

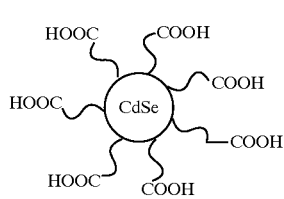

(Formula 4)

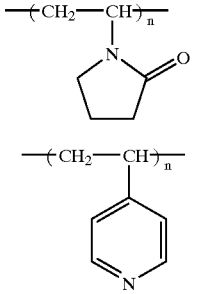

(Formula 5)

Formula 6

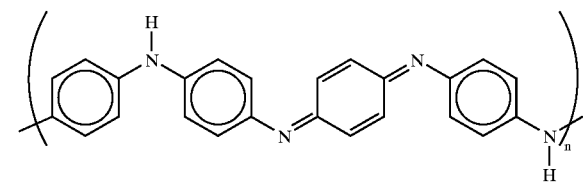

Formula 7

For introducing material (A) to the substrate, the material (A) can be dropped or sprayed onto the substrate or the substrate can be instantly immersed in a solution of material (A). After or during the introduction of the material (A), the substrate is rotated by a spinner.

Because the spinning of the substrate is typically performed at a high speed, the uniform coating is completed in 4 sec to 200 sec. The spin SA method of the present invention employs the attractive intermolecular force between adjacent layers and the viscous force due to the facile solvent removal during spinning, and consequently the coating materials are more easily adsorbed onto the substrate and the first coating can be completed in a very short period time.

Subsequently, a washing solvent is dropped onto the center of the substrate and the spinner is operated at 500 rpm to 30000 rpm for 4 sec to 200 sec. This washing step is repeated 0 to 3 times and removes the weakly-bound material (A), forming the flat monolayer thin film of the material (A).

As a next step, another material (B) capable of bonding with the first coated material (A) through the intermolecular forces such as ionic attraction, covalent bonding, ion-metal coordination or hydrogen bonding is introduced onto the substrate in the same way as in the first coating process and the second washing step is also carried out, forming another flat monolayer thin film of the material (B).

If above mentioned processes are repeated, multilayer ultrathin films can be prepared. In particular, the multilayer can be composed of two different materials (ABABAB . . . ) as well as more than two materials (for example, ABCAB-CABC . . . , ABCDABCD . . . , CBADCBAD . . . , etc.).

The conventional dipping SA method depends on spontaneous adsorption and rearrangement of the adsorbed species requiring long adsorption time, whereas the spin SA method of the present invention is carried out under the force field with high spinning speed and thus takes a remarkably short time for the films with a high internal order within layers as well as a high degree of planarization.

Furthermore, in case of preparing multilayer ultrathin films with the conventional dipping SA method, the weakly-adsorbed layer needs to be removed by the solvent washing in order to obtain uniform film surface, and the drying step of the washing solvent is sometimes necessary. However, in the spin SA method of the present invention, the weakly adsorbed materials are easily removed by the centrifugal force during spinning, and thus the adsorption and elimination of excess material can be simultaneously carried out.

In addition, the present invention makes it possible to control the film thickness in the range of 4 Å to 100 Å. More specifically, the thickness of the films prepared using the ionic attraction can be controlled by changing the concentration of the coating solution, the added amount of ionic salt, pH of the solution and spinning speed, and the thickness of the films prepared using the hydrogen bonding can be controlled by changing the concentration of the coating solution and the spinning speed of the spinner.

Figure 2A:
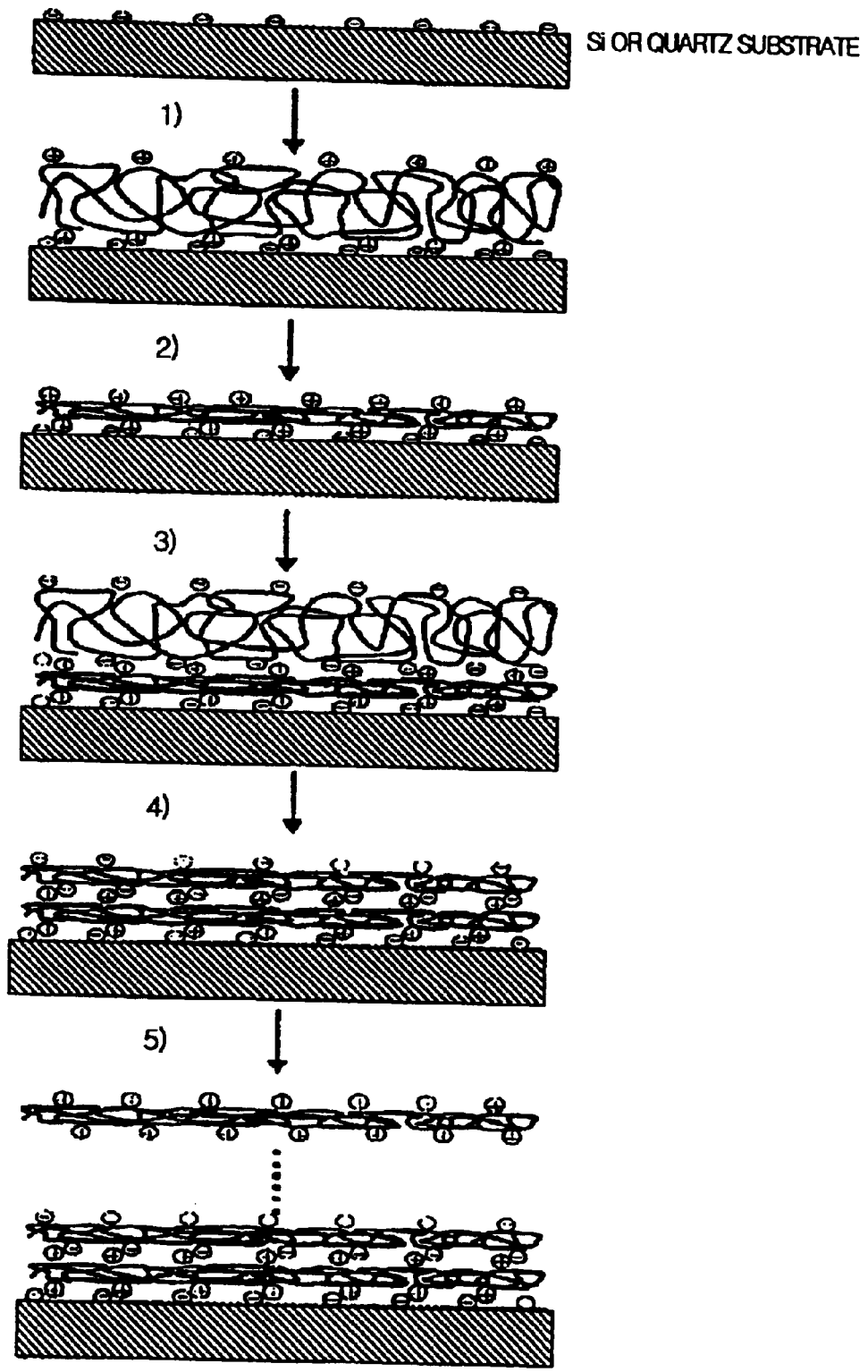
FIG. 2a is a schematic example of a process based on the present invention for fabricating an organic/organic multilayer ultrathin film.
Figure 2B:
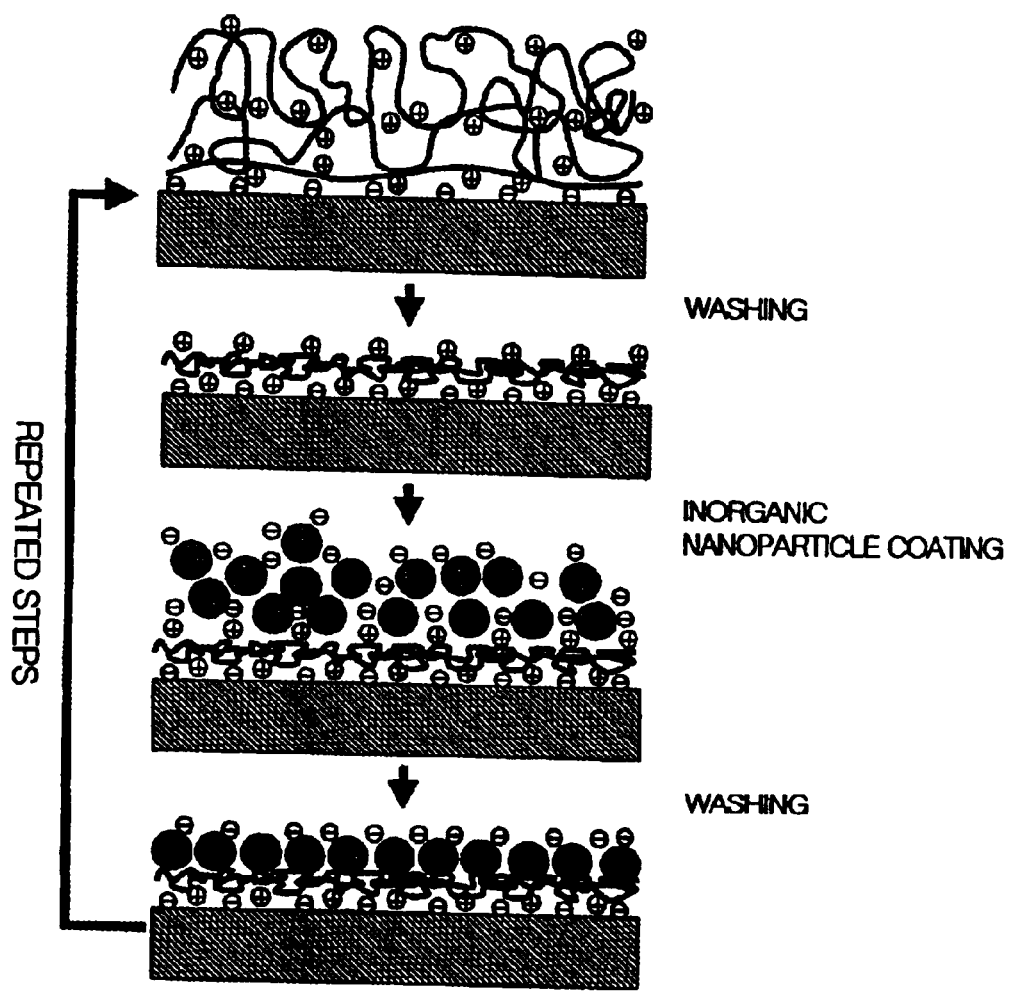
FIG. 2b is a schematic example of a process based on the present invention for fabricating an organic/inorganic multilayer ultrathin film.

The spin SA method of the present invention is schematically explained in FIG. 2a and FIG. 2b. The FIG. 2a shows the process for the organic-organic multilayer ultrathin film while the FIG. 2b depicts the process for the organic-inorganic multilayer ultrathin film.

The present invention will be further understood by the following examples.

EXAMPLE 1a

Quartz substrates with typical dimension of (1.3 cm×4.5 cm) for the deposition of polyelectrolytes were initially cleaned by ultrasonification in a hot mixture of $H_2SO_4/H_2O_2$ (7/3) for 3 hours. They were then heated in a mixture of $H_2O/H_2O_2/NH_3$ (5/1/1) at 80° C. for 1 hour, and subsequently dried by $N_2$ gas purging. After this procedure, the substrates were negatively charged and placed on a spinner. Then, 2 ml of 0.01 M PAH were dropped onto the substrate and the substrate was rotated with a spinner at 3000 rpm for 15 sec.

After the deposition of the first organic layer, the substrates were thoroughly rinsed twice with plenty of deionized water. The spinning time and the speed for the washing step were also identical to those for the layer deposition.

The above two steps (deposition+washing) were repeated with PSS polyelectrolyte and these four steps are repeated as many times as to obtain multilayer thin films with a bilayer number of 1, 2, 4, 6, 10, 12, 14, 16, 18, 20.

Figure 3A:
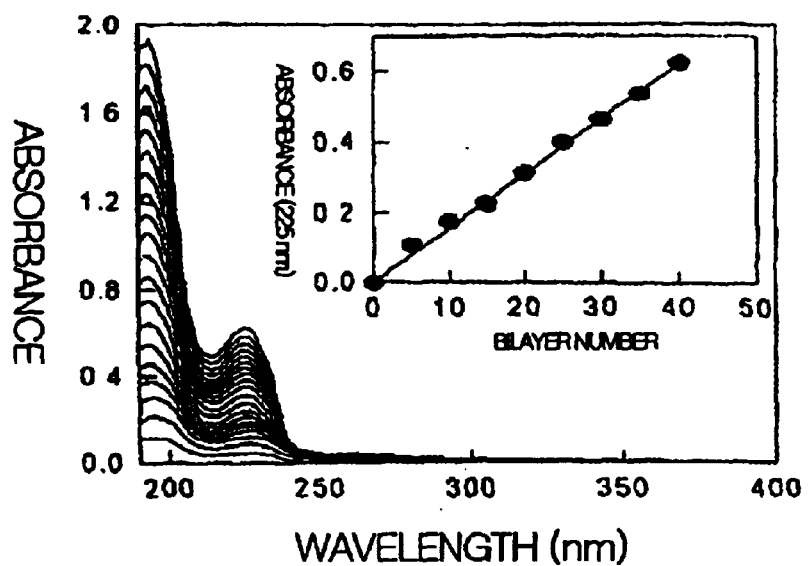
FIG. 3a illustrates an UV/Vis absorption spectra of spin self-assembled PAH/PSS multilayers with different numbers of bilayer with an inset figure showing the absorbance growth of PAH/PSS multilayers prepared by the spin SA method based on the present invention.

FIG. 3a shows the UV/visible absorption spectra of the produced films with increasing the number of bilayers with an inset showing the absorbance at 225 nm as a function of bilayer number. The absorbance at 225 nm in the UV region was assigned to be the contribution from the adsorbed PSS chains.

In FIG. 3a, a linear relationship was obtained for the peak absorbance as a function of bilayer number. This implies that the adsorbed amount of PSS in a bilayer was almost uniform.

EXAMPLE 1b

Quartz substrates with typical dimension of (1.3 cm×4.5 cm) for the deposition of polyelectrolytes were initially cleaned by ultrasonification in a hot mixture of $H_2SO_4/H_2O_2$ (7/3) for 3 hours. They were then heated in a mixture of $H_2O/H_2O_2/NH_3$ (5/1/1) at 80° C. for 1 hour, and subsequently dried by $N_2$ gas purging. After this procedure, the substrates were negatively charged and placed on a spinner. Then, 1 ml of 5 mM PAH was dropped on the substrate and the substrate was rotated with a spinner at 4000 rpm for 15 sec. After the deposition of the first layer, the substrates were thoroughly rinsed twice with plenty of deioninzed water. The spinning time and the speed for the washing step were also identical to those for the layer deposition.

Then, 1 ml of 2 nm CdS nanoparticles with concentration of 0.6 mM was dropped on the substrate and the substrate was rotated with a spinner at 4000 rpm for 15 sec and the substrates were thoroughly rinsed twice with plenty of deionized water with the same spinning time and speed.

The above four steps were repeated several times and multilayer thin films with a bilayer number of 1, 2, 4, 6, 10, 12, 14, 16, 18, 20 were produced.

Figure 3B:
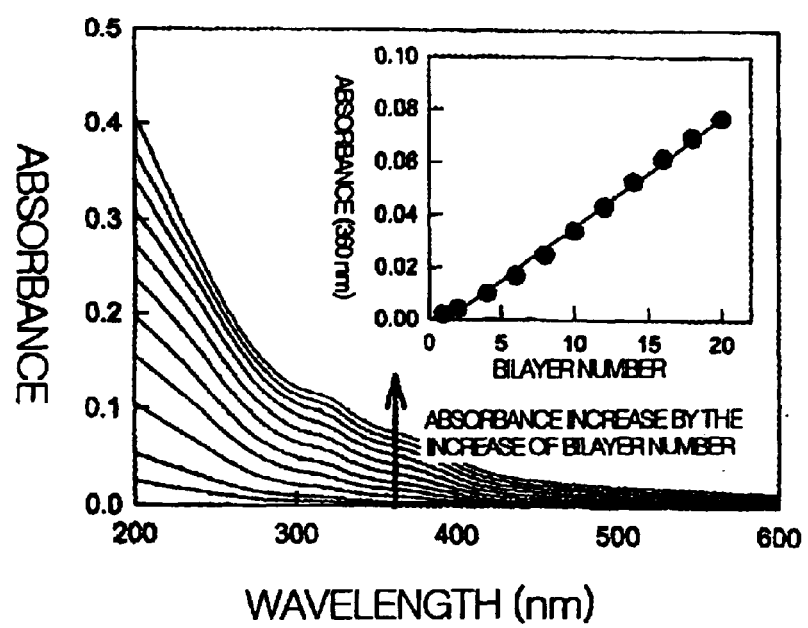
FIG. 3b illustrates an UV/Vis absorption spectra of the spin self-assembled PAH/CdS multilayers with different numbers of bilayers with an inset figure showing the absorbance growth of PAH/CdS multilayers prepared by the spin SA method based on the present invention.

FIG. 3b shows the UV/Visible absorption spectra of the produced films with increasing the number of bilayers with an inset showing the absorbance at 360 nm as a function of bilayer number. The absorbance at 360 nm in the UV region was assigned to be the contribution from the adsorbed CdS with negative charge.

In FIG. 3b, a linear relationship was obtained for the peak absorbance as a function of bilayer number. This implies that the adsorbed amount of CdS in a bilayer was almost uniform.

EXAMPLE 2a

Figure 4A:
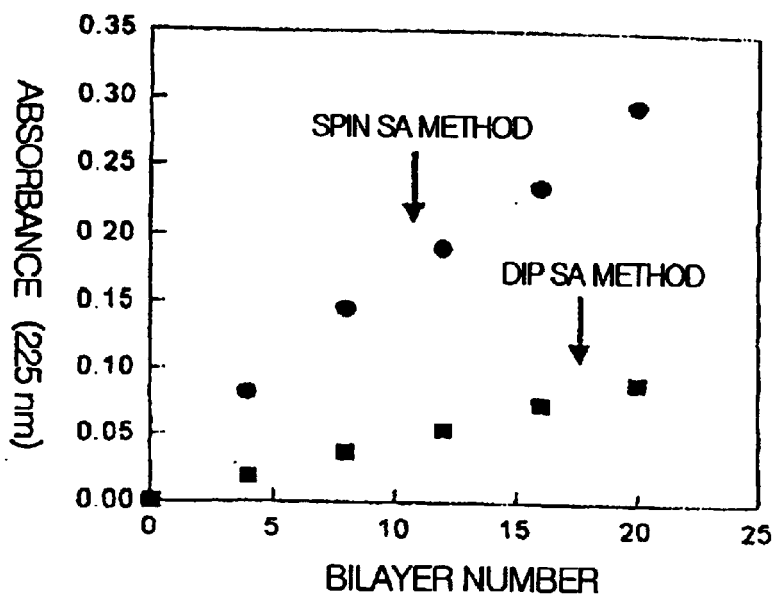
FIG. 4a illustrates a comparison of the spin SA method of the present invention and the conventional dipping SA method for the absorbance increase of PAH/PSS multilayers as a function of the number of bilayers.

Multilayer thin films with bilayer numbers of 4, 8, 12, 16, 20 were prepared according to the same procedure of Example 1a except with the spinning speed of 4000 rpm. The absorbance of the films at 225 nm is shown in FIG. 4a.

EXAMPLE 2b

Figure 4B:
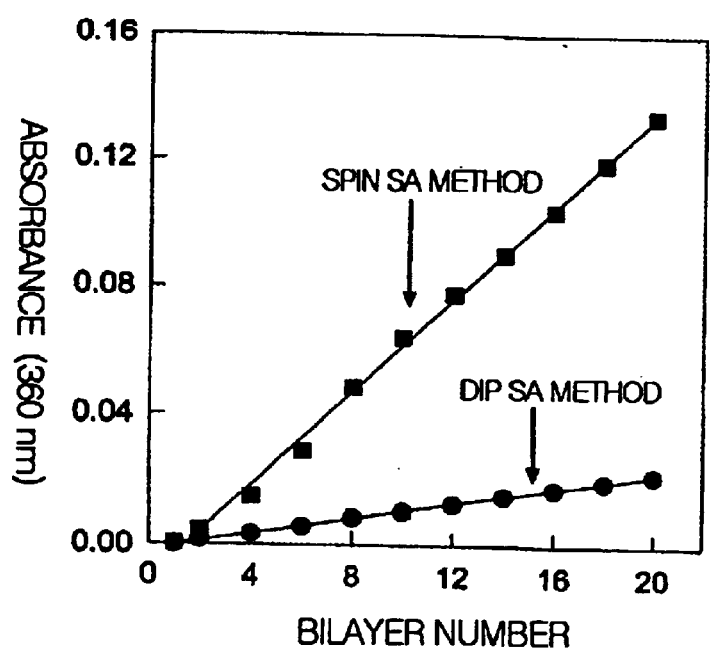
FIG. 4b illustrates a comparison between the spin SA method of the present invention and the conventional dipping SA method for the absorbance increase of PAH/CdS multilayers as a function of the number of bilayers.

Multilayer thin films with bilayer number of 1, 2, 4, 6, 8, 12, 16, 20 were prepared according to the same procedure of Example 1b except the spinning speed of 4000 rpm and with a PAH mole concentration of 10 mM. The absorbance of the films at 360 nm is shown in FIG. 4b.

COMPARATIVE EXAMPLE 1a

A negatively charged quartz substrate with a typical dimension of (1.3 cm×4.5 cm) was dipped into 10 mM PAH solution for 20 min and then washed with distilled water for 2 min twice.

The coated substrate was dipped into 10 mM PSS solution for 20 min and then washed with distilled water for 2 min twice.

The entire above steps were repeated several times and multilayer thin films with bilayer numbers of 4, 8, 12, 16, 20 are prepared and the absorbance of the formed thin films was measured at 225 nm (FIG. 4a).

COMPARATIVE EXAMPLE 1b

A negatively charged quartz substrate with a typical dimension of (1.3 cm×4.5 cm) was dipped into 10 mM PAH solution for 20 min and then washed with distilled water for 2 min twice.

The coated substrate was dipped into 0.6 mM of negatively charged CdS solution for 20 min and then washed with distilled water for 2 min twice.

The entire above steps were repeated several times and multilayer thin films with bilayer number of 4, 8, 12, 16, 20 are produced and the absorbance of the formed thin films was measured at 360 nm (FIG. 4b).

As shown in FIG. 4a and FIG. 4b, the adsorbed amounts of films formed by the spin SA method of the present invention was much larger than those formed by the conventional dipping SA method. This significant difference in the adsorbed amount between the dipping and the spinning method is caused by different adsorption mechanism. In the case of the conventional SA method by the dipping process, polyelectrolyte chains are allowed to diffuse toward the substrate due to the electrostatic interaction and then the adsorbed chains rearrange themselves on the surface.

On the other hand, the adsorption and rearrangement of adsorbed chains on the surface and the elimination of weakly bound polymer chains from the substrate in the spin SA process are almost simultaneously achieved by a high spinning speed in a short time. The fast elimination rate of water by the spinning process significantly increases the mole concentration of the polyelectrolyte solution during the short deposition time and this increase in the polyelectrolyte concentration yields thick layers despite the thin film formation typically provided by the centrifugal force and air shear force.

It also increases the electrostatic attraction between oppositely charged polymers because the presence of water molecules in the assemblies generally screens the electrostatic attraction. In other words, when water molecules are adsorbed onto a substrate, the preadsorbed water molecules may block the polyelectrolyte adsorption onto the surface, and thus the surface coverage with polyelectrolyte chains may be incomplete. However, if polymer adsorption and water drainage were almost simultaneously realized in a short time, as in the case of the spinning self-assembly process, there would be more room for the absorption of polyelectrolytes onto the substrate.

EXAMPLE 3a

Figure 5A:
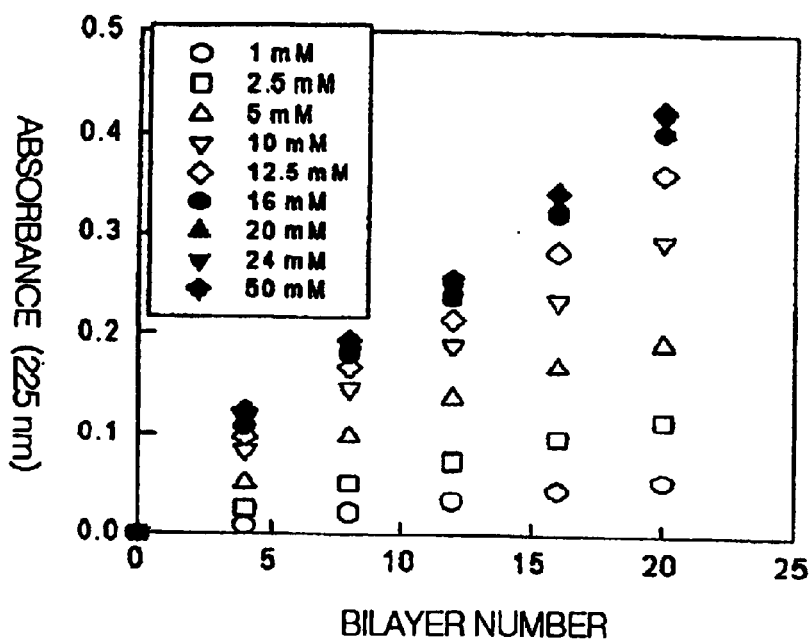
FIG. 5a illustrates a graph showing the increase in absorbance of PAH/PSS multilayer prepared by the method of the present invention as a function of bilayer number with different mole concentrations of PAH and PSS.

In order to investigate the adsorption of polyelectrolyte chains assisted by the viscous and electrostatic forces during the spinning process, the dependence of the mole concentration of polyelectrolyte solutions on the adsorbed amount was determined as a function of the number of (PAH/PSS) bilayers. For this purpose, multilayer thin films were prepared according to the Example 1a for 1 mM, 2.5 mM, 5 mM, 10 mM, 12.5 mM, 16 mM, 20 mM, 24 mM and 50 mM of PAH and PSS concentration except that the spin speed was 4000 rpm and the bilayer numbers were 2, 4, 12, 16 and 20. The absorbance of the formed thin films was measured at 225 nm (FIG. 5a).

Furthermore, the Table 1 quantitatively shows both the adsorbed amount and the thickness per bilayer with increasing the mole concentration of polyelectrolytes.

TABLE 1

| Mole concentration (mM) | 1 | 2.5 | 5 | 10 | 12.5 | 16 | 20 | 24 | 50 |
|---|---|---|---|---|---|---|---|---|---|
| Thickness per bilayer (nm) | 0.4 | 0.84 | 1.63 | 2.50 | 3.37 | 3.72 | 3.76 | 3.93 | 3.97 |

EXAMPLE 3b

Figure 5B:
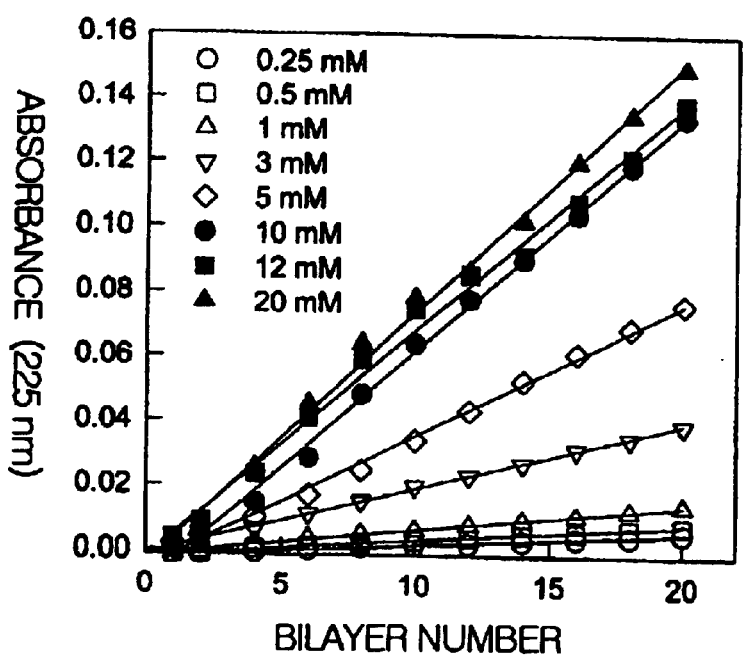
FIG. 5b illustrates a graph showing the increase in absorbance of PAH/CdS multilayer prepared by the method of the present invention as a function of bilayer number with different mole concentrations of PAH.

Multilayer thin films were prepared according to the Example 1b for 1 mM, 2.5 mM, 5 mM, 10 mM, 12.5 mM, 16 mM, 20 mM of PAH concentration except that the spin speed was 4000 rpm and the numbers of bilayer were 1, 2, 4, 6, 8, 10, 12, 14, 16, 18 and 20 at a fixed concentration of CdS solution of 0.6 mM. The absorbance of the formed thin films was measured at 360 nm (FIG. 5b). For example, the thickness per bilayer made using 10 mM PAH and 0.6 mM CdS was about 26 Å.

These observations suggest that it is possible to precisely control the adsorbed amount of polyelectrolytes in multilayer films by simply changing solution concentration in spite of the strong repulsion among polyelectrolyte chains with the same charge. Although the increase of solution concentration tends to produce a thicker adsorbed polymer layer due to the viscous and electrostatic effect, the excess adsorbed layer with weak binding sites are readily eliminated by the centrifugal and air shear forces.

In other words, the film thickness per bilayer can be controlled in the range from several Å to several tens of Å.

EXAMPLE 4

Figure 6:
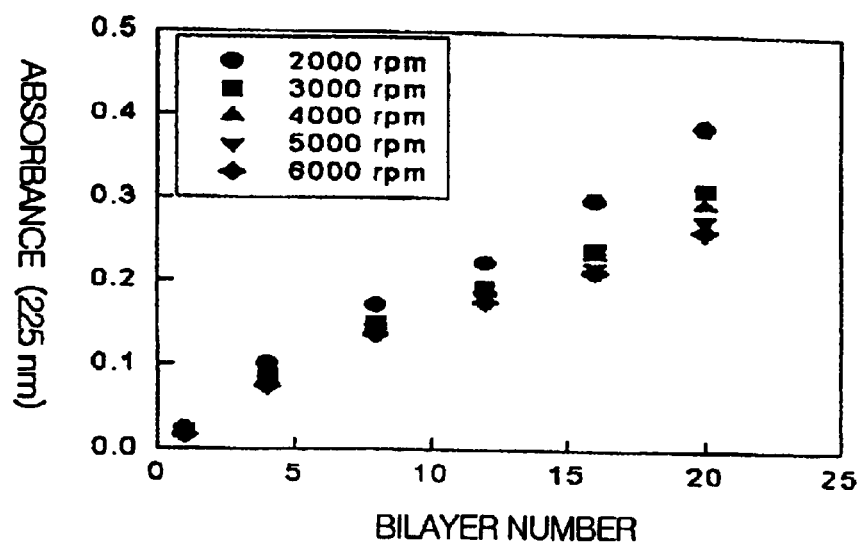
FIG. 6 is a graph for showing the increase in absorbance of PAH/PSS multilayer prepared by the method of the present invention as a function of bilayer number with different spin speeds.

Multilayer thin films with bilayer numbers of 4, 8, 12, 16 and 20 were prepared according to the Example 1a at various spin speeds of 2000 rpm, 3000 rpm, 4000 rpm, 5000 rpm and 6000 rpm. FIG. 6 shows the absorbance at 225 nm of the prepared thin films as a function of bilayer number for the indicated spin speeds.

As shown in FIG. 6, the absorbance, linearly proportional to the film thickness, decreases with the spin speed. This is because the higher spin speed increases the centrifugal force and the weakly bound layer become more easily eliminated.

EXAMPLE 5

Multilayer thin films with bilayer numbers of 2, 4, 8, 12, 16 and 20 were prepared according to the Example 1a except that the concentration of sodium chloride in the 10 mM PSS is 0 M, 0.1 M, 0.5 M and 1.0 M.

Figure 7:
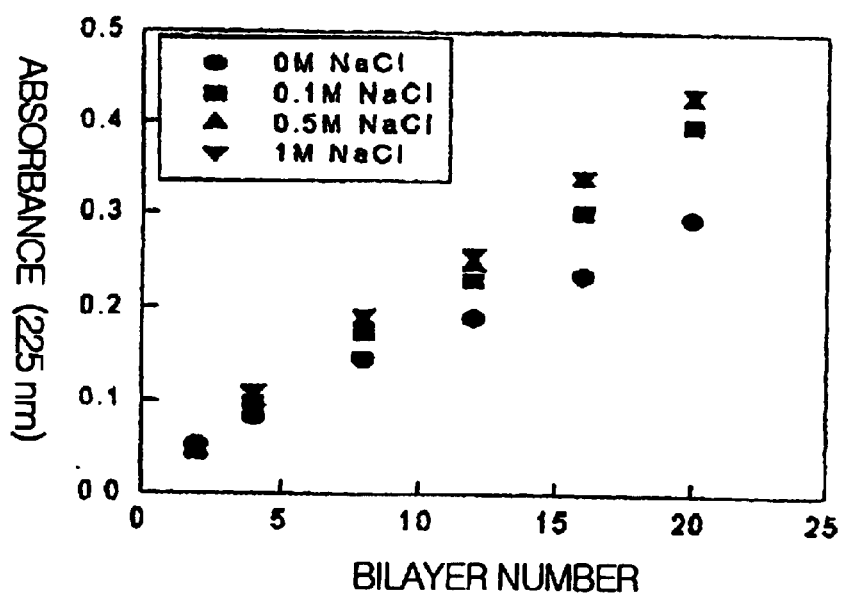
FIG. 7 is a graph for showing the increase in absorbance of PAH/PSS multilayer prepared by the method of the present invention as a function of bilayer number with different mole concentrations of NaCl added to PSS solution.

The absorbance at 225 nm of the prepared thin films as a function of bilayer number for the indicated sodium chloride concentrations is shown in FIG. 7.

It shows that the absorbance increases as sodium chloride is added. This means that the ionic salt such as sodium chloride changes chain conformation in the solution.

EXAMPLE 6

Multilayer thin films with bilayer numbers of 2, 4, 8, 12, 16 and 20 were prepared according to the Example 1a except with a spin speed of 4000 rpm, for the pHs of PAH of 5.8, 4.5, 3.2 and 2.5.

Figure 8:
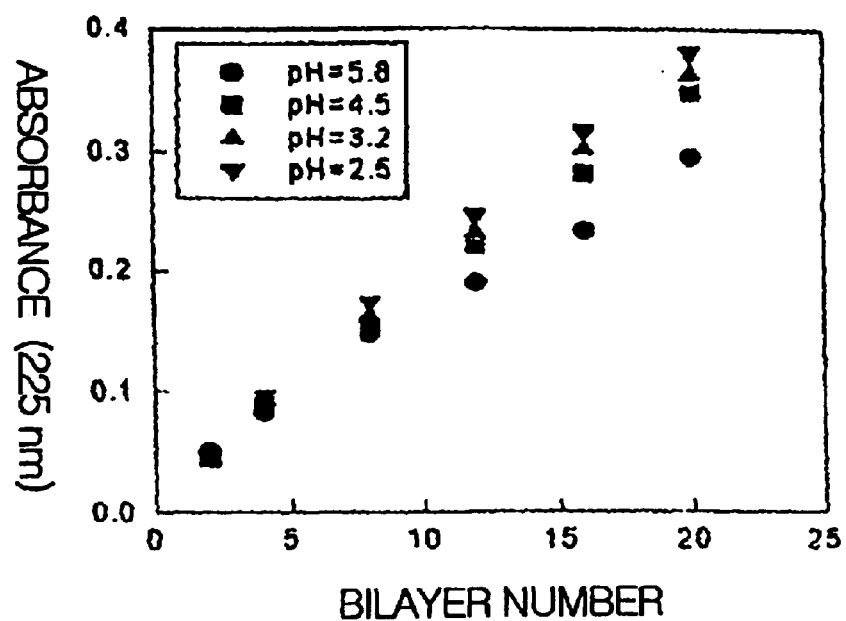
FIG. 8 is a graph for showing the increase in absorbance in PAH/PSS multilayer prepared by the method of the present invention as a function of bilayer number with different pH values of PAH.

The absorbance at 225 nm of the prepared thin films as a function of bilayer numbers for the indicated pHs of PAH is shown in FIG. 8. This shows that the absorbance increases as the pH of PAH solution is decreased.

EXAMPLE 7

Figure 9:
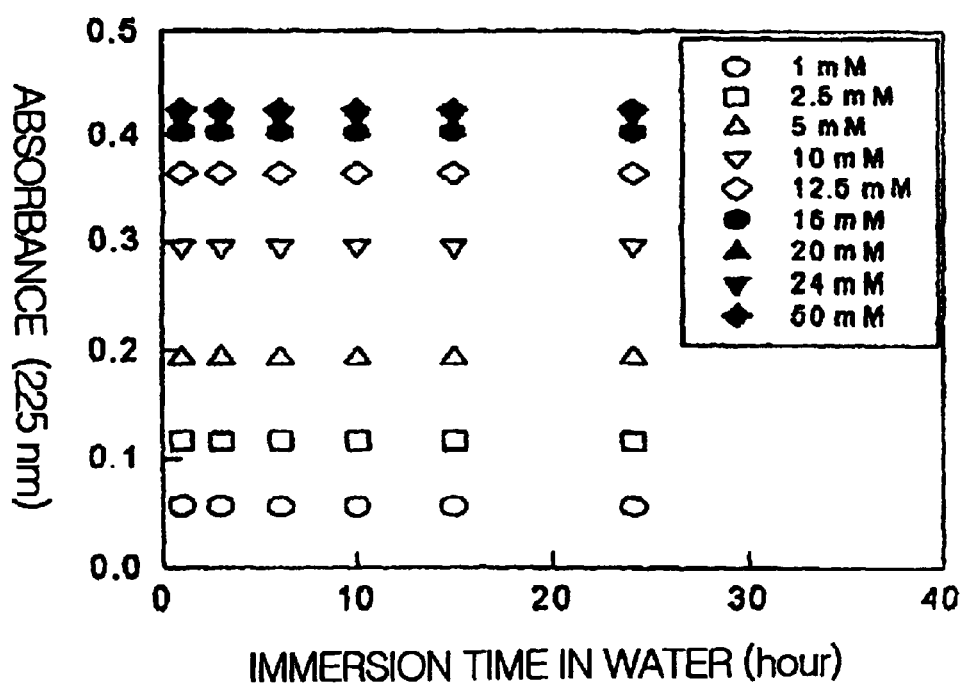
FIG. 9 is a graph for showing the increase in absorbance of PAH/PSS multilayer prepared by the method of the present invention as a function of immersion time in water with different concentrations of PAH and PSS.

Multilayer thin films with a bilayer number of 20 were prepared according to the Example 1a except with a spin speed of 4000 rpm, for the PSS concentrations of 1 mM, 2.5 mM, 5 mM, 10 mM, 12.6 mM, 16 mM, 20 mM, 24 mM and 50 mM. The prepared thin films were dipped in distilled water. The absorbance at 225 nm of the prepared thin films is shown as a function of immersion time in FIG. 9. This shows that there was no significant change in the absorbance after the immersion of the films in water for extended time. This result implies that the multilayers prepared are fairly dense and stable irrespective of different thickness of bilayer.

EXAMPLE 8

Multilayers containing 20 bilayer were prepared according to the Example 2b and the Comparative Example 1b and their thin film surfaces were examined with Atomic Force Microscopy.

Figure 10:
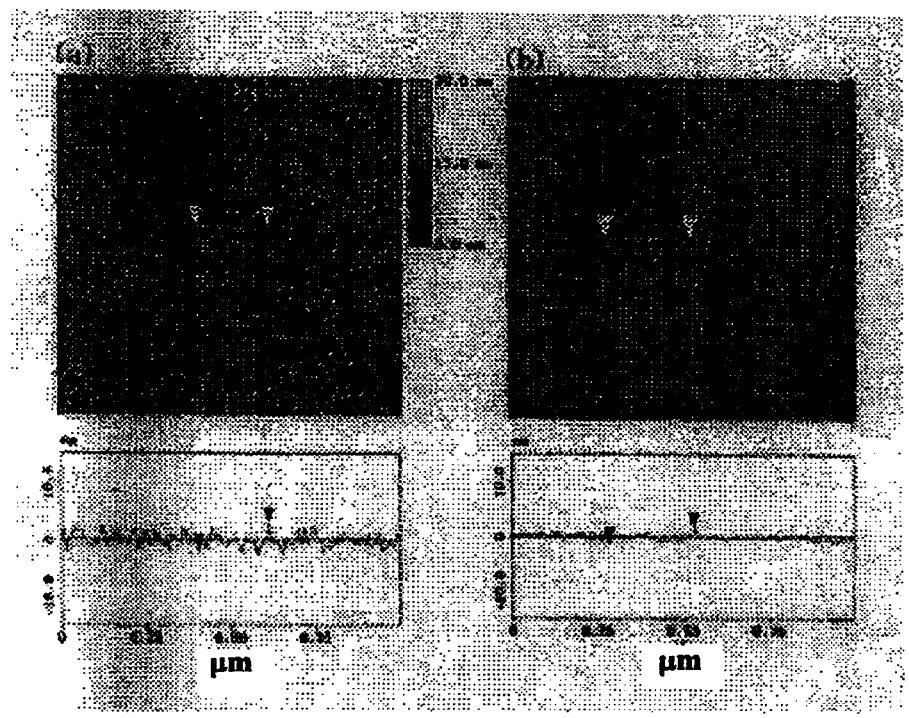
FIG. 10 illustrates the tapping mode AFM images of PAH/CdS multilayer films prepared by (a) the conventional dipping SA method and (b) the spin SA method based on the present invention.

As shown FIG. 10, the whole thickness and the surface roughness was 520 Å and about 5 Å, respectively for the films formed by the spin SA method of the present invention, whereas equivalent quantities were 134 Å and about 18 Å, respectively for the films formed by the dipping SA method. This indicates that the surface roughness of a film prepared by the spin SA method of present invention is much lower than that of the dipping SA method.

In addition, in case of the spin SA method of present invention, the bilayer thickness of (PAH/CdS), 26 Å, was larger than the size of CdS nanoparticle (20 Å), whereas in the case of the conventional dipping SA method, the bilayer thickness of (PAH/CdS), 7 Å, is much smaller than the size of CdS nanoparticle.

This means that for the multilayer films prepared by the dipping SA method, the layer density is fairly low and the internal structure of the multilayer film is not well ordered, while for the multilayer films prepared by the spin SA method of present invention, the layer density is remarkably high and each bilayer contains well ordered CdS nanoparticles.

EXAMPLE 9

Figure 11:
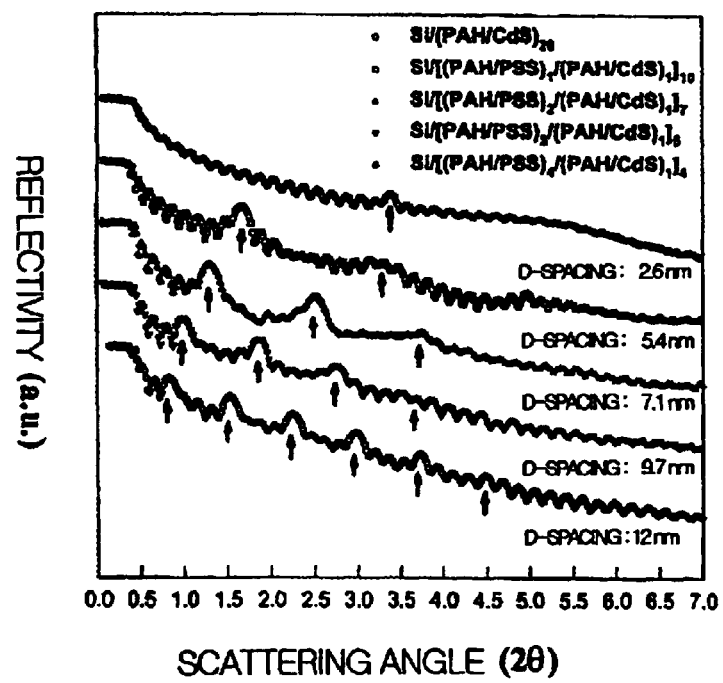
FIG. 11 illustrates the X-ray reflectivity curves of organic-inorganic multilayer ultrathin films using PAH, PSS and negatively charged CdS prepared by the spin SA method based on the present invention.

Multilayer thin films of $Si/[(PAH/PSS)_n/(PAH/CdS)_1]_m$, [(n+1)×m=20 or 21] were prepared using 10 mM PAH, 10 mM PSS and 0.6 mM negatively-charged CdS nanoparticles according (TO) the Example 2b, and the internal structure of the film was investigated by X-ray Reflectivity (FIG. 11).

As shown in FIG. 11, small oscillation peaks and relatively big Bragg peaks were found for all the multilayer thin films prepared. The small oscillation peaks result from the total film thickness and the Bragg peaks originate from the significant electron density difference between a polyelectrolyte layer and an inorganic CdS nanoparticle layer. The existence of Bragg peak indicates that internal structures of the multilayer films are quite well ordered.

In addition, the increase of organic PAH and PSS combined layer with similar electron densities between inorganic layers, moves the Bragg peak toward the low scattering angle value. In this graph, the interlayer distance between the CdS nanoparticle layer and the organic layer are changed from 26 Å to 120 Å as the thickness of combined PAH and PSS organic layer is increased.

EXAMPLE 10

Figure 12:
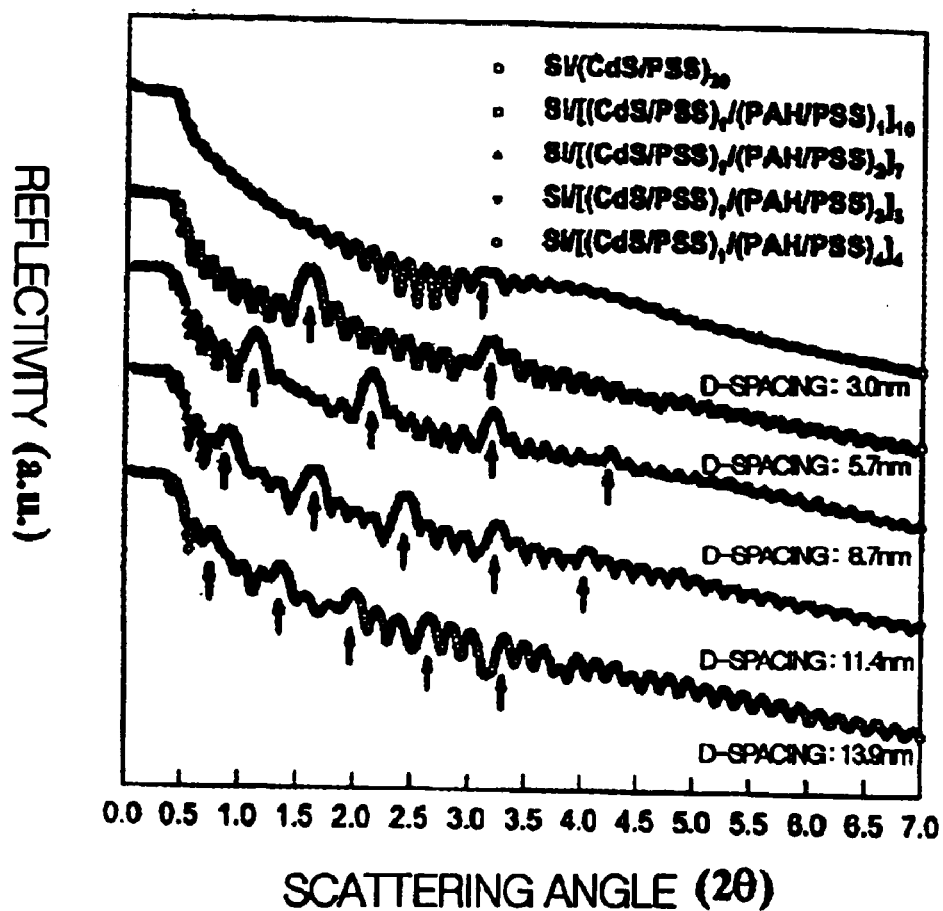
FIG. 12 illustrates the X-ray reflectivity curves of organic-inorganic multilayer ultrathin films using PAH, PSS and positively charged CdS prepared by the spin SA method according to the present invention.

Multilayer thin films of $Si/[(CdS/PSS)_n/(PAH/PSS)_1]_m$, [(n+1)×m=20 or 21] were prepared according to the Example 9 except the positively charged CdS nanoparticles were used, and the internal structure of the film was investigated by X-ray reflectivity(FIG. 12).

In this example, the Bragg peaks were again distinctly shown for all the multilayer thin films. As the insertion of organic layer between the inorganic layers is increased, the interlayer distance between the organic layer and the inorganic layer was changed from 30 Å to 139 Å.

Figure 13:
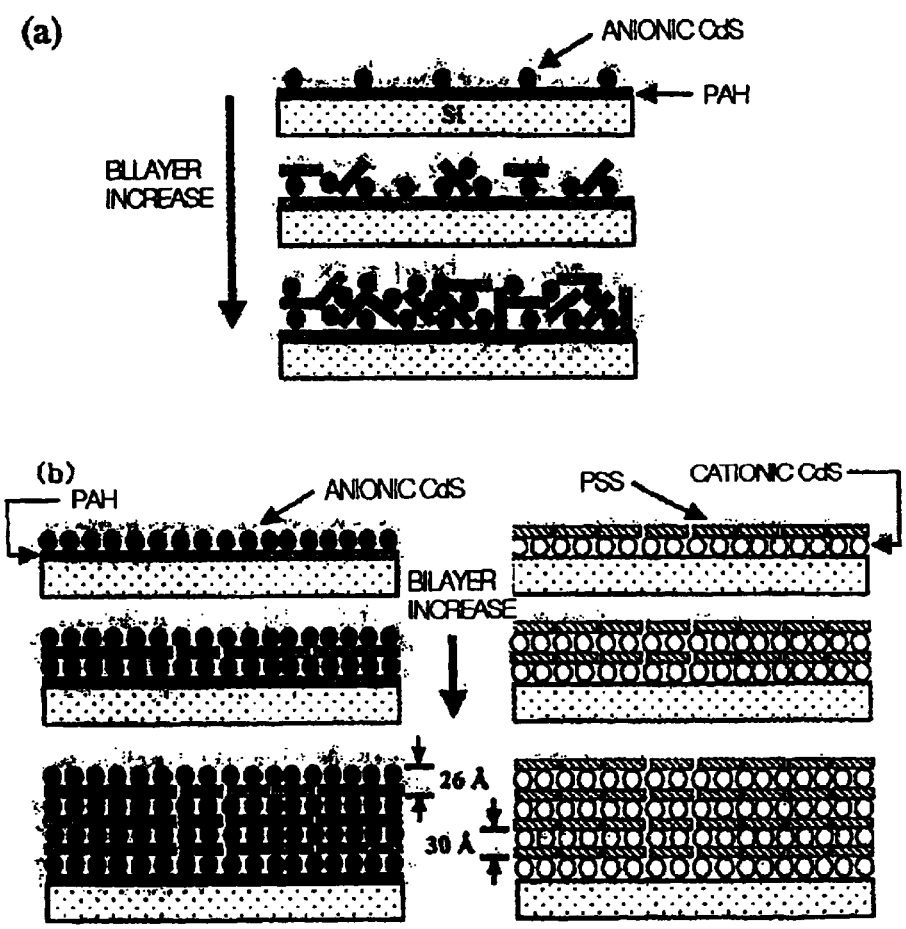
FIG. 13 illustrates the schematics of internal structures of organic-inorganic multilayer ultrathin films prepared by (a) the conventional dipping SA method and (b) the spin SA method based on the present invention.

FIG. 13 shows schematics representing the difference in the internal structures of the multilayers prepared by the conventional dipping SA method and the spin SA method of the present invention. As shown in the FIG. 13, the spin SA method of present invention easily provides the well-ordered internal structure, which cannot be achieved with the conventional dipping SA method.

EXAMPLE 11a

Negatively charged quartz substrates with a typical dimension of (1.3 cm×4.5 cm) were placed on a spinner.

Then, 2 ml of 10 mM aqueous polyaniline solution were dropped on the substrate and the substrate was rotated with a spin coater at 4000 rpm for 15 sec. Subsequently, the substrates were thoroughly rinsed twice with distilled water of pH 2.5 and rotated with the same spin speed and time as above.

Then, 2 ml of 10 mM aqueous poly(vinylpyrrolidone) solution were dropped on the substrate and the substrate was rotated with a spin coater at 4000 rpm for 15 sec. Then, the substrates were thoroughly rinsed twice with distilled water of pH 5.5 and rotated with the same spin speed and time as above.

Figure 14:
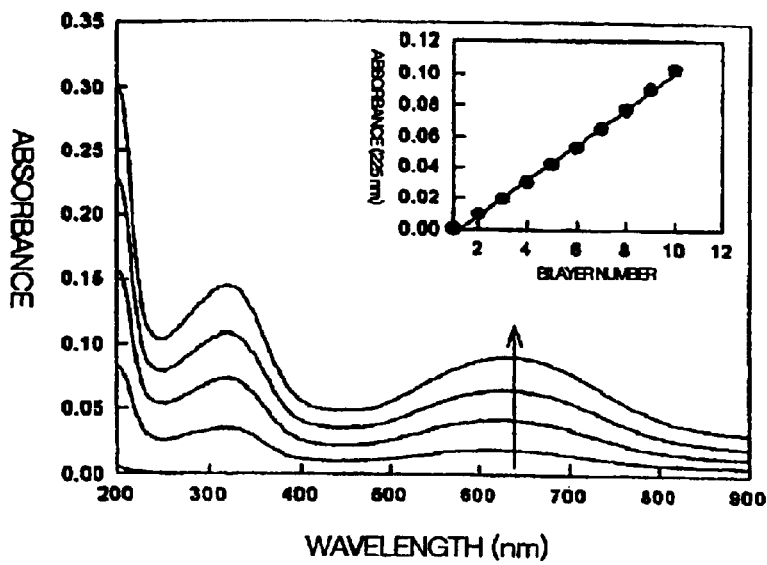
FIG. 14 illustrates the UV/Vis absorption spectra and the absorbance growth as a function of the number of bilayers for organic-organic multilayer ultrathin film prepared using the hydrogen-bonding between polyaniline and poly(vinyl pyrrolidone) based on the present invention.

The entire above steps were repeated several times and multilayer thin films with bilayer number of 2, 4, 6, 8 and 10 were prepared. The absorption spectra for multilayer thin films were measured and the absorbance at 630 nm as a function of bilayer number is shown in FIG. 14. The broad absorbance band at 500 nm to 800 nm results from polyaniline.

The aqueous polyanilne solution used in this example was prepared by dissolving emerald base type polyaniline into acetamide solution in a concentration of 20 mg/ml for 8 to 10 hours, purifying it using a 0.45 □m filter, diluting the 10 ml of the filtered polyaniline into the distilled water adjusted to pH 3.0 to 3.5 with methansulfonic acid and adjusting the pH of the solution to 2.5 to 2.6.

The polyvinylpyrrolidone was in this example prepared by diluting its concentration to 10 mM.

FIG. 14 shows the UV/visible absorption spectra of the produced films with increasing the number of bilayers with an inset showing the absorbance at 630 nm as a function of bilayer number. In FIG. 14, a linear relationship was obtained for the peak absorbance as a function of bilayer number, demonstrating that the adsorbed amount of polyaniline was almost uniform and high quality multilayer thin films with desired property can also be prepared by using materials capable of hydrogen bonding.

EXAMPLE 11b

A silicon substrate containing negatively charged hydroxyl groups with a typical dimension of (2 cm×2 cm) was placed onto a spin coater and 10 mM of poly (vinylpyridine) in DMF was dropped onto the substrate, followed by rotation of the substrate at 4000 rpm for 15 sec. Then, 2 ml of DMF were dropped onto the coated substrate and the substrate was rotated at 4000 rpm for 15 sec twice.

Subsequently, 2 ml of CdSe nanoparticles with an average size of 2 nm in DMF was dropped onto the substrate and rotated at 4000 rpm for 15 sec. Then, 2 ml of DMF were dropped onto the coated substrate and the substrate was rotated at 4000 rpm for 15 sec twice.

The entire above steps were repeated several times and a multilayer thin film with 10 bilayers was prepared.

With above film, X-ray reflectivity was measured in order to investigate the thermal stability of the internal structure of the organic-inorganic multilayer thin film.

Figure 15:
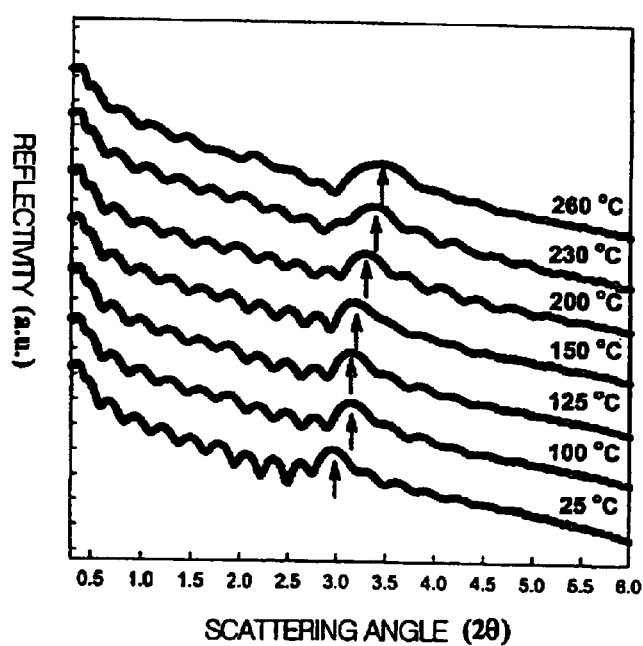
FIG. 15 illustrates the X-ray reflectivity curves with the different temperatures for organic-inorganic multilayer ultrathin films prepared using hydrogen bonding between poly(vinyl pyridine) and CdSe based on the present invention.

As shown in FIG. 15, the organic-inorganic thin film prepared at room temperature has distinct Bragg peak demonstrating a well-ordered internal structure of the film and a highly-ordered structure) remains up to 260° C.

The change of the Bragg peak with increase in the temperature indicates that the interlayer distance between the organic poly(vinylpyridine) layer and inorganic CdSe layer was decreased from 30 Å to 25 Å. In other word, the residual DMF solvent evaporates and the individual layers become more densely packed.

The result shows that the organic-inorganic multilayer thin film prepared employing the hydrogen bonding which is known to be weaker than the electrostatic interaction, can also have (A) quite well-ordered internal structure and such a structure is also stable even at a high temperature.

Modifications and variations of the method in the present invention will be obvious to those skilled in the art from the foregoing detailed description. Such modifications and variations are intended to come within the scope of the following claims.

What is claimed is:

1. A process for fabricating ultrathin multilayer films, the process comprising the steps of:
    introducing positive or negative charge or a material capable of hydrogen bonding to a substrate and placing said substrate on a spinner to pretreat said substrate;
    dropping a material (A) bindable with the material deposited onto the substrate, and spinning the substrate 2000 rpm to 6000 rpm for 4 to 200 seconds in a first coating step;
    dropping washing solvent onto the substrate after completion of the first coating and spinning the substrate at 2000 rpm to 6000 rpm for 4 to 200 sec to remove weakly-bound material (A) and form a thin film (A) in a first washing step;
    dropping another material (B) bindable with the material (A) coated onto the substrate and further coating it under the same conditions as for the first coating in a second coating step; and
    dropping washing solvent onto the substrate after completion of the second coating and spinning the substrate at 2000 rpm to 6000 rpm for 4 to 200 sec to remove weakly-bound material (B) and form a thin film (B) in a second washing step; wherein the coating and washing steps are more than once repeated.

2. A process according to claim 1, wherein the washing steps are repeated 0 to 3 times between coating steps.

3. A process according to claim 2, wherein the materials of layers can be bound to each other by the electrostatic ionic bonding, hydrogen bonding, ion-metal coordination or chemical bonding.

4. A process according to claim 2, wherein the thickness of the respective thin films are controlled by solution concentration, addition of ionic salt, pH control, and spinning speed control.

5. A process according to claim 2, wherein the washing steps are performed twice between coating steps.

6. A process according to claim 5, wherein the thickness of the respective thin films are controlled by solution concentration, addition of ionic salt, pH control, and spinning speed control.

7. A process according to claim 2, wherein the washing steps are conducted with deionized water.

8. A process according to claim 7, wherein the thickness of the respective thin films are controlled by solution concentration, addition of ionic salt, pH control, and spinning speed control.

9. A process according to claim 1, wherein the materials of layers can be bound to each other by the electrostatic ionic bonding, hydrogen bonding, ion-metal coordination or chemical bonding.

10. A process according to claim 1, wherein the thickness of the respective thin films are controlled by solution concentration, addition of ionic salt, pH control, and spinning speed control.

11. A process according to claim 1, wherein two or more different organic layers are alternatively laminated, or organic layer and inorganic layer are alternatively laminated.

* * * * *